(12) United States Patent
Takahama et al.

(10) Patent No.: US 8,664,034 B2
(45) Date of Patent: Mar. 4, 2014

(54) METHOD OF MANUFACTURING SOLAR CELL

(75) Inventors: Tsuyoshi Takahama, Neyagawa (JP); Masayoshi Ono, Sumoto (JP); Hiroyuki Mori, Kaizuka (JP); Youhei Murakami, Izumisano (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 13/203,509

(22) PCT Filed: Feb. 26, 2010

(86) PCT No.: PCT/JP2010/053087
§ 371 (c)(1),
(2), (4) Date: Oct. 26, 2011

(87) PCT Pub. No.: WO2010/098446
PCT Pub. Date: Sep. 2, 2010

(65) Prior Publication Data
US 2012/0052622 A1   Mar. 1, 2012

(30) Foreign Application Priority Data
Feb. 26, 2009   (JP) .................................. 2009-044435

(51) Int. Cl.
*H01L 21/00*   (2006.01)
(52) U.S. Cl.
USPC ..................... 438/96; 257/E31.003

(58) Field of Classification Search
USPC .................................. 438/96; 257/E31.003, 257/E27.123–E27.126
See application file for complete search history.

(56) References Cited

U.S. PATENT DOCUMENTS

| | | | |
|---|---|---|---|
| 6,242,686 | B1 | 6/2001 | Kishimoto et al. |
| 2005/0062041 | A1 | 3/2005 | Terakawa et al. |
| 2008/0000522 | A1 | 1/2008 | Johnson et al. |
| 2009/0223562 | A1 | 9/2009 | Niira et al. |
| 2011/0000532 | A1 | 1/2011 | Niira et al. |

FOREIGN PATENT DOCUMENTS

| | | |
|---|---|---|
| JP | 11-354820 A | 12/1999 |
| JP | 2002-280584 A1 | 9/2002 |
| JP | 2005-101151 A | 4/2005 |
| JP | 2008-21993 A | 1/2008 |
| WO | WO2008-050889 A1 | 5/2008 |
| WO | WO2009-096539 A1 | 8/2009 |

*Primary Examiner* — Tony Tran
(74) *Attorney, Agent, or Firm* — Marvin A. Motsenbocker; Mots Law, PLLC

(57) ABSTRACT

A method for manufacturing a solar cell (100) includes the steps of: a step of cleaning an exposed region (R2) on a rear surface of an n-type crystalline silicon substrate (10n), wherein the step is carried out subsequent to a step of patterning an i-type amorphous semiconductor layer (11i) and a p-type amorphous semiconductor layer (11p) and prior to a step of forming an i-type amorphous semiconductor layer (12i).

6 Claims, 11 Drawing Sheets

METHOD OF MANUFACTURING SOLAR CELL

TECHNICAL FIELD

The present invention relates to a method of manufacturing a back contact solar cell.

BACKGROUND ART

Solar cells can convert sunlight, which is clean and is available in unlimited amounts, directly into electricity. Therefore, solar cells are expected as a new energy source.

Conventionally, a so-called back contact solar cell is proposed which includes a plurality of p-side electrodes and a plurality of n-side electrodes on the back surface of an n-type semiconductor substrate (see Patent Document 1, for example).

The solar cell described in Patent Document 1 is manufactured by the following method. First, the back surface of a substrate is cleaned. Next, a first mask having a predetermined pattern is provided on the back surface of the substrate, and an i-type semiconductor layer, a p-type semiconductor layer and p-side electrodes are formed in this order. Then, after removal of the first mask, an i-type semiconductor layer and an n-type semiconductor layer are formed in this order on the back surface of the substrate and also on the p-side electrodes. Next, a second mask is provided on the n-type semiconductor layer, and n-side electrodes are formed.

PRIOR ART DOCUMENT

Patent Document

Patent Document 1: Japanese Patent Application Publication No. 2005-101151 (paragraph [0039], FIG. 2)

SUMMARY OF THE INVENTION

Here, in order to prevent recombination of carriers on the back surface of the substrate, a cleaning process is preferably performed on a region of the back surface of the substrate where the first mask is provided, before the i-type semiconductor layer and the n-type semiconductor layer are formed in this order.

However, if the cleaning process such for example as a wet etching process is performed after formation of the p-side electrodes, a component material of the ionized p-side electrodes contaminates the back surface of the substrate. Meanwhile, if the cleaning process is performed before formation of the p-side electrodes, a component material of the p-side electrodes contaminates the back surface of the substrate during formation of the p-side electrodes. Accordingly, with the technique described in Patent Document 1, it is difficult to adequately prevent recombination of carriers on the back surface of the substrate.

The present invention has been made in view of the aforementioned situation, and an objective of the present invention is to provide a method of manufacturing a solar cell capable of preventing recombination of carriers.

A method of manufacturing a solar cell according to a feature of the present invention is summarized as including: a step A of forming a first semiconductor layer having a first conductivity type on a first region of a main surface of a semiconductor substrate; a step B of cleaning a second region of the main surface; and a step C of forming a second semiconductor layer having a second conductivity type on the second region of the main surface and also on the first semiconductor layer.

With the method of manufacturing a solar cell according to the aspect of the present invention, the second semiconductor layer can be formed on the second region after the second region of the main surface is cleaned. Accordingly, it is possible to prevent recombination of carriers in a boundary between the main surface of the semiconductor substrate and the second semiconductor layer.

In the method of manufacturing a solar cell according to the feature of the present invention, the step A may include the steps of: forming a third semiconductor layer having the first conductivity type on an almost entirety of the main surface; covering by a resist film, a portion of the third semiconductor layer which is formed on the first region; removing a portion of the third semiconductor layer which is exposed from the resist film; and removing the resist film.

In the method of manufacturing a solar cell according to the feature of the present invention, the method may include a step of forming a recombination layer on the first semiconductor layer between the step A and the step B, wherein the second semiconductor layer may be formed on the second region and also on the recombination layer in the step C.

In the method of manufacturing a solar cell according to the feature of the present invention, the semiconductor substrate may have the first conductivity type.

In the method of manufacturing a solar cell according to the feature of the present invention, the recombination layer may a semiconductor layer having the first conductivity type, and the amount of impurities of the first conductivity type contained in the semiconductor layer may be larger than the amount of impurities of the first conductivity type contained in the first semiconductor layer.

In the method of manufacturing a solar cell according to the feature of the present invention, the recombination layer may be a layer formed by mixing elements of a different kind in the first semiconductor layer.

In the method of manufacturing a solar cell according to the feature of the present invention, the recombination layer may be a microcrystalline semiconductor layer, and each of the first semiconductor layer and the second semiconductor layer may be an amorphous semiconductor layer.

In the method of manufacturing a solar cell according to the feature of the present invention, the recombination layer may have a thickness of 1 to 10 nm.

According to the present invention, it is possible to provide a method of manufacturing a solar cell capable of preventing recombination of carriers.

MODES FOR CARRYING OUT THE INVENTION

Figure 1:
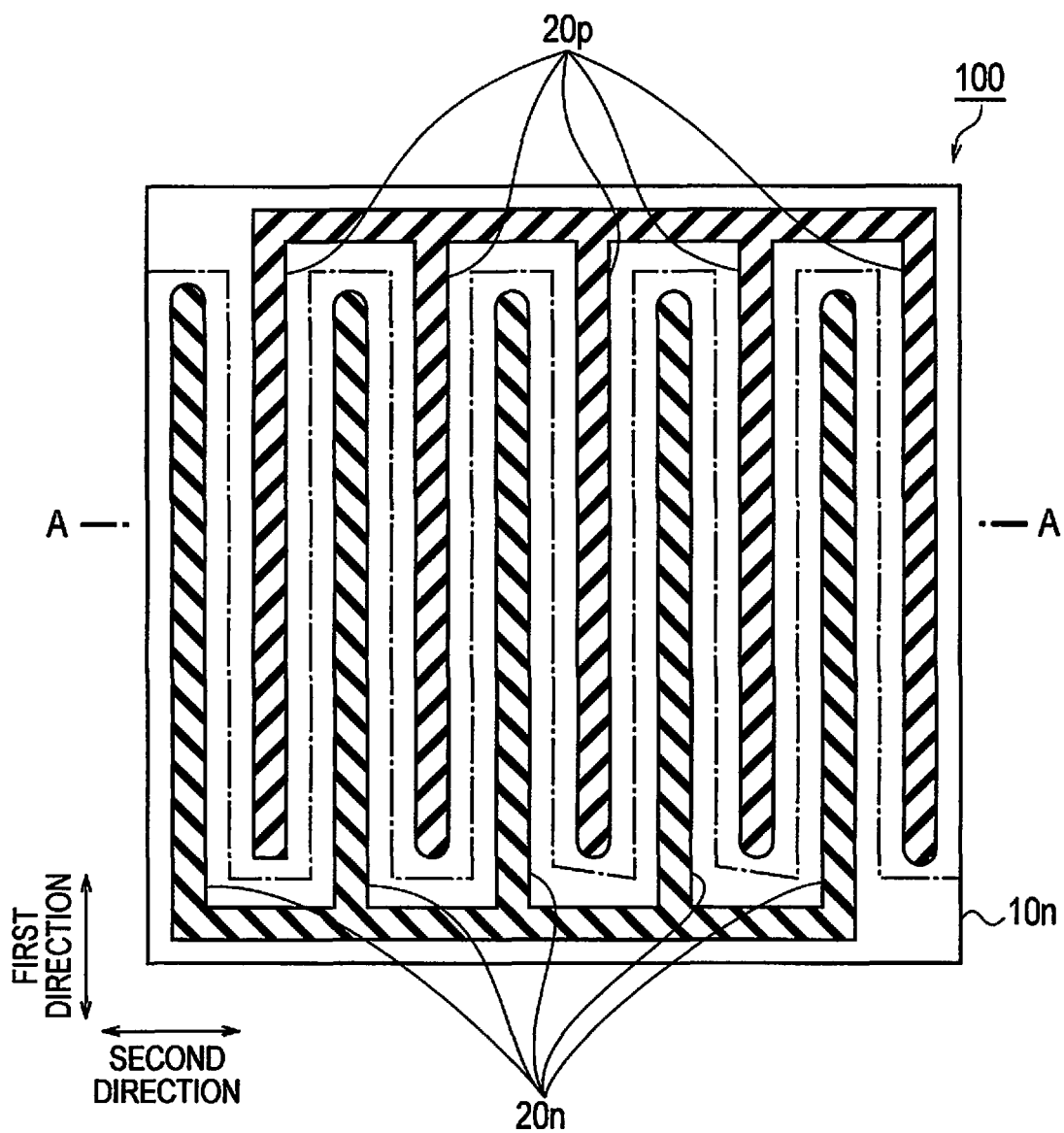
FIG. 1 is a plan view showing a back surface side of a solar cell 100 according to a first embodiment of the present invention.

With reference to the drawings, embodiments of the present invention will be described. In the following description of the drawings, the same or similar parts will be denoted by the same or similar reference numerals. However, it should be noted that the drawings are schematic and ratios of respective dimensions and the like are different from actual ones. Therefore, the specific dimensions, etc., should be determined in consideration of the following explanations. It is needless to say that relations and ratios among the respective dimensions differ among the diagrams.

First Embodiment

Configuration of Solar Cell

Figure 2:
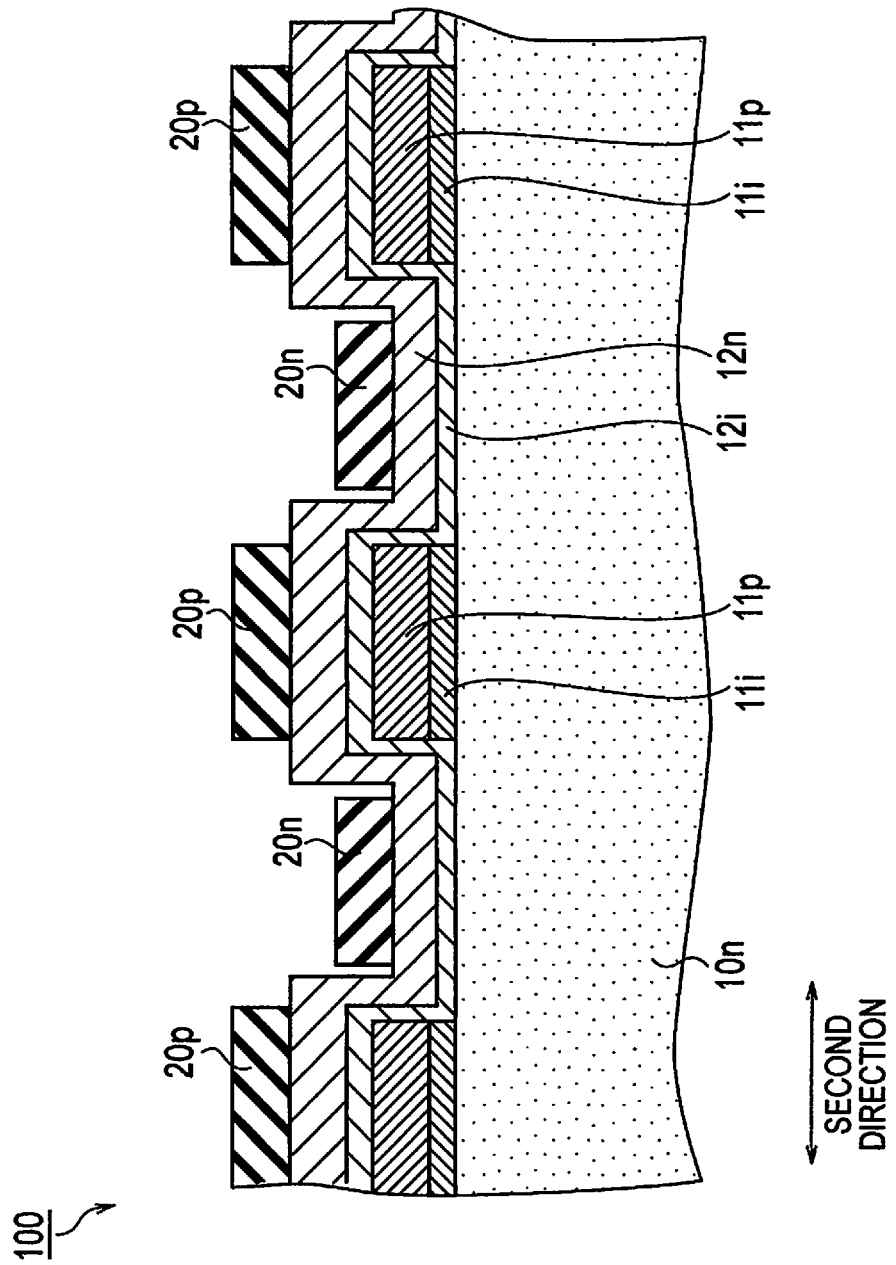
FIG. 2 is an enlarged cross-sectional view taken along the line A-A of FIG. 1.

The configuration of a solar cell 100 according to the first embodiment of the present invention will be explained with reference to FIG. 1 and FIG. 2. FIG. 1 is a plan view of the back surface side of the solar cell 100 according to the first embodiment. FIG. 2 is an enlarged cross-sectional view along the A-A line of FIG. 1.

As illustrated in FIG. 1 and FIG. 2, the solar cell 100 includes an n-type crystalline silicon substrate 10n, an i-type amorphous semiconductor layer 11i, a p-type amorphous semiconductor layer 11p, an i-type amorphous semiconductor layer 12i, an n-type amorphous semiconductor layer 12n, p-side electrodes 20p and n-side electrodes 20n.

The n-type crystalline silicon substrate 10n is formed of thin plate-shaped monocrystalline silicon or polycrystalline silicon. The n-type crystalline silicon substrate 10n has a light-receiving surface to receive sunlight, and a back surface provided on a side opposite to the light-receiving surface. The n-type crystalline silicon substrate 10n generates photogenerated carriers by the light received on the light-receiving surface. The photogenerated carrier includes an electron and a hole produced when light is absorbed into the n-type crystalline silicon substrate 10n. Although not illustrated, it should be noted that a structure (e.g., an electrode) that prevents light being incident thereon is not formed on the light receiving surface of the n-type crystalline silicon substrate 10n, and light can be received on the entire light receiving surface.

The i-type amorphous semiconductor layer 11i is formed along a first direction on the back surface of the n-type crystalline silicon substrate 10n. The i-type amorphous semiconductor layer 11i is formed without actively introducing an impurity. The i-type amorphous semiconductor layer 11i has a thickness not to practically contribute to the generation of electricity, e.g., a thickness of about several Å to 250 Å.

The p-type amorphous semiconductor layer 11p is formed along the first direction on the i-type amorphous semiconductor layer 11i. The p-type amorphous semiconductor layer 11p has p-type conductivity. The p-type amorphous semiconductor layer 11p has a thickness of about 10 nm, for example.

Note that, the i-type amorphous semiconductor layer 11i may not be formed, but is preferably formed because the structure in which the i-type amorphous semiconductor layer 11i and the p-type amorphous semiconductor layer 11p are formed in this order on the n-type crystalline silicon substrate 10n (so called, "HIT structure") can improve the p-n junction characteristics.

The i-type amorphous semiconductor layer 12i is formed on the back surface of the n-type crystalline silicon substrate 10n and also on the p-type amorphous semiconductor layer 11p. In the first embodiment, the i-type amorphous semiconductor layer 12i is formed so as to cover substantially the entire back surface of the n-type crystalline silicon substrate 10n. The i-type amorphous semiconductor layer 12i is formed without active introduction of impurities. The i-type amorphous semiconductor layer 12i has a thickness of about several Å to 250 Å, for example.

The n-type amorphous semiconductor layer 12n is formed on the i-type amorphous semiconductor layer 12i. In the first embodiment, the n-type amorphous semiconductor layer 12n is formed so as to cover the i-type amorphous semiconductor layer 12i. The n-type amorphous semiconductor layer 12n has n-type conductivity different from the conductivity type of the p-type amorphous semiconductor layer 11p. The n-type amorphous semiconductor layer 12n has a thickness of about 10 nm, for example.

Note that, the structure in which the n-type amorphous semiconductor layer 12n is formed above the n-type crystalline silicon substrate 10n (so called, "BSF structure") makes it possible to prevent recombination of minority carriers in the boundary between the back surface of the n-type crystalline silicon substrate 10n and the amorphous semiconductor layer.

In addition, the structure in which the thin i-type amorphous semiconductor layer 12i is inserted between the back surface of the n-type crystalline silicon substrate 10n and the n-type amorphous semiconductor layer 12n makes an improvement in the characteristics of a portion between the back surface of the n-type crystalline silicon substrate 10n and the n-type amorphous semiconductor layer 12n.

Here, each of the i-type amorphous semiconductor layer 11i, the i-type amorphous semiconductor layer 12i, the p-type amorphous semiconductor layer 11p and the n-type amorphous semiconductor layer 12n can be formed of an amorphous semiconductor containing silicon. Examples of the amorphous semiconductor containing silicon include amorphous silicon, amorphous silicon carbide, amorphous silicon germanium and the like, but the amorphous semiconductor containing silicon is not limited to these examples, and other amorphous semiconductor can be used as well. In addition, each of the i-type amorphous semiconductor layer 11i, the i-type amorphous semiconductor layer 12i, the p-type amorphous semiconductor layer 11p and the n-type amorphous semiconductor layer 12n may be formed of amorphous semiconductor of one kind or a combination of amorphous semiconductor of two or more kinds.

The p-side electrodes 20p each are a collecting electrode configured to collect carriers. The p-side electrodes 20p are formed above the p-type amorphous semiconductor layer 11p across the i-type amorphous semiconductor layer 12i and the n-type amorphous semiconductor layer 12n. Accordingly, the p-side electrodes 20p are each formed in a line shape along the first direction.

The n-side electrodes 20n are each a collecting electrode configured to collect carriers. The n-side electrodes 20n are formed above the back surface of the n-type crystalline silicon substrate 10n across the i-type amorphous semiconductor layer 12i and the n-type amorphous semiconductor layer 12n. Accordingly, the n-side electrodes 20n are each formed in a line shape along the first direction between one of the p-side electrodes 20p and another one of the p-side electrodes 20p.

Note that, the n-side electrodes 20n and the p-side electrodes 20p may be each formed in a single-layered structure or a multilayered structure. In a case where the multilayered structure is employed, a transparent conductive layer may be provided on a side close to the n-type amorphous semiconductor layer 12n. As the transparent conductive layer, a transparent conductive oxide such as indium oxide, tin oxide or zinc oxide or the like can be used, for example.

Moreover, the n-side electrodes 20n and the p-side electrodes 20p may be each formed to substantially cover the entire surface of a corresponding one of the p-type amorphous semiconductor layer 11p or the n-type amorphous semiconductor layer 12n. Thus, even in a case where the sheet resistance of the p-type amorphous semiconductor layer 11p or the n-type amorphous semiconductor layer 12n is not so small, the p-side electrodes 20p and the n-side electrodes 20n can adequately collect carriers.

(Method of Manufacturing Solar Cell)

Next, a description will be given of a method of manufacturing the solar cell 100 with reference to the cross-sectional views of the solar cell 100.

Figure 3:
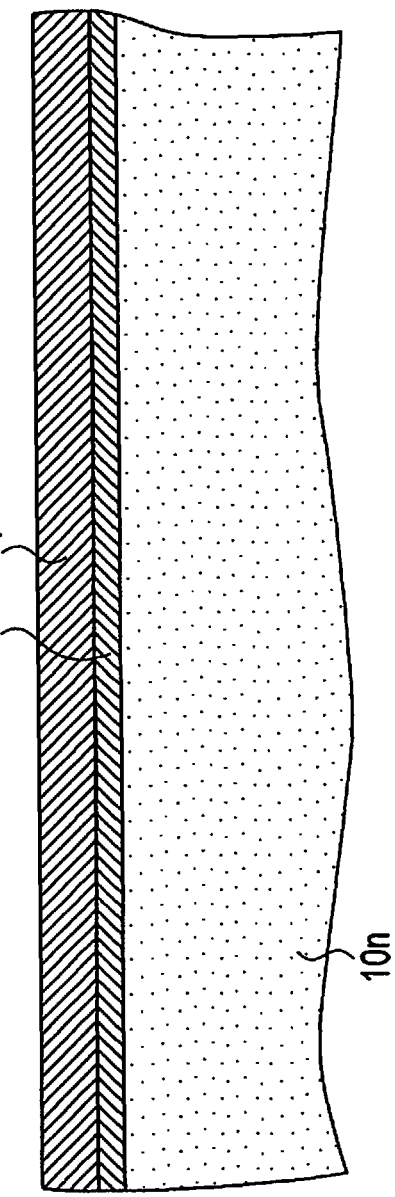
FIG. 3 is a diagram explaining the method of manufacturing a solar cell 10 according to the first embodiment of the present invention.

As illustrated in FIG. 3, the i-type amorphous semiconductor layer 11i and the p-type amorphous semiconductor layer 11p are formed in this order on the entire back surface of the n-type crystalline silicon substrate 10n by use of a CVD method.

Figure 4:
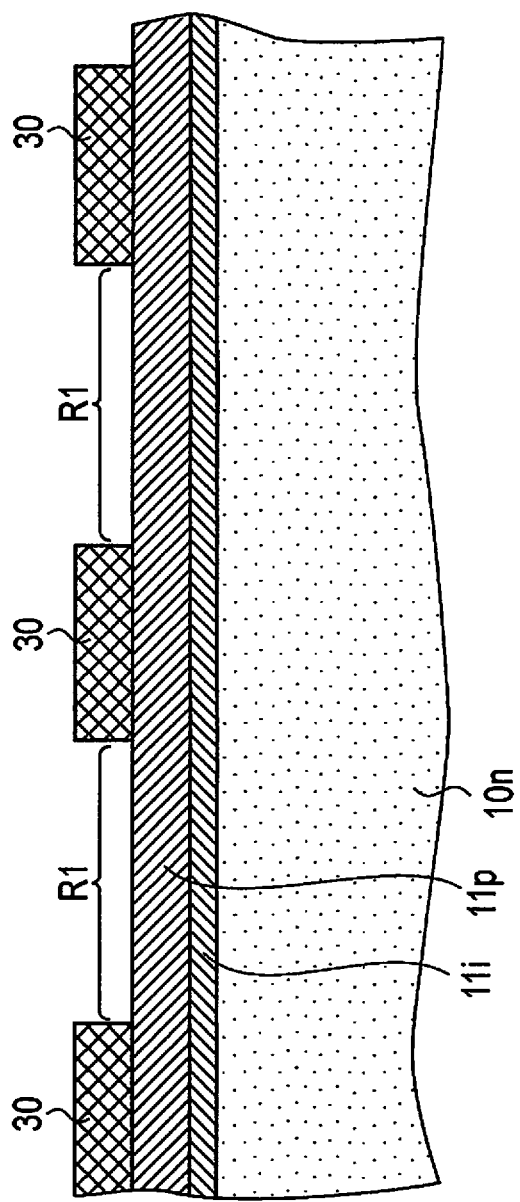
FIG. 4 is a diagram explaining the method of manufacturing the solar cell 10 according to the first embodiment of the present invention.

Next, as illustrated in FIG. 4, a resist film 30 is applied onto the p-type amorphous semiconductor layer 11p in a predetermined pattern. The predetermined pattern corresponds to regions where the p-side electrodes 20p are to be formed. Thus, the predetermined pattern is set along a dashed-dotted line of FIG. 1 as the basis, for example. Subsequently, a wet etching process is performed for removal of exposed regions R1 of the i-type amorphous semiconductor layer 11i and the p-type amorphous semiconductor layer 11p, which are exposed from the resist film 30. Thus, the i-type amorphous semiconductor layer 11i and the p-type amorphous semiconductor layer 11p are patterned.

Figure 5:
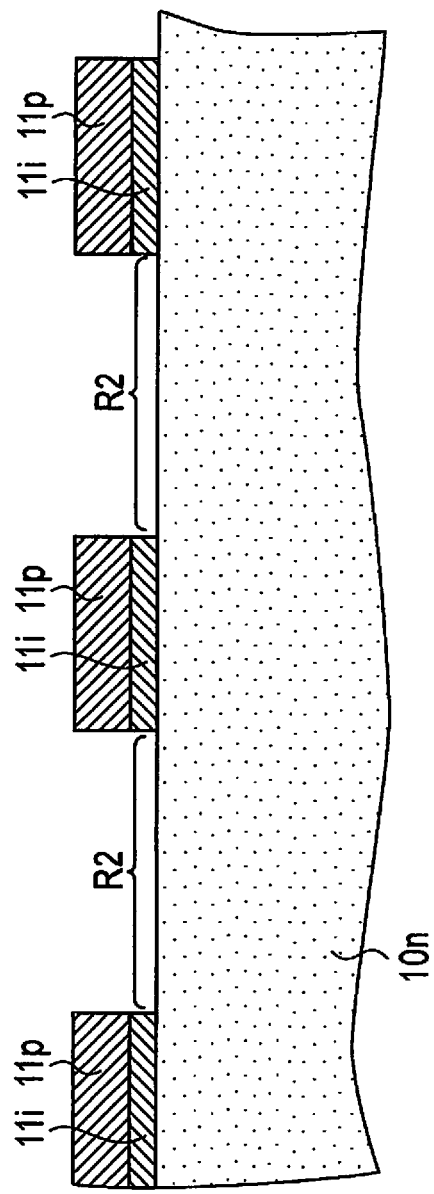
FIG. 5 is a diagram explaining the method of manufacturing the solar cell 10 according to the first embodiment of the present invention.

Next, as illustrated in FIG. 5, after removal of the resist film 30, a wet etching process and a hydrogen plasma process are performed for cleaning exposed regions R2 of the back surface of the n-type crystalline silicon substrate 10n, which are the exposed regions thereof. Note that, the amount of the wet etching process and the hydrogen plasma process applied onto the surface of the p-type amorphous semiconductor layer 11p is preferably set to be small in this case.

Figure 6:
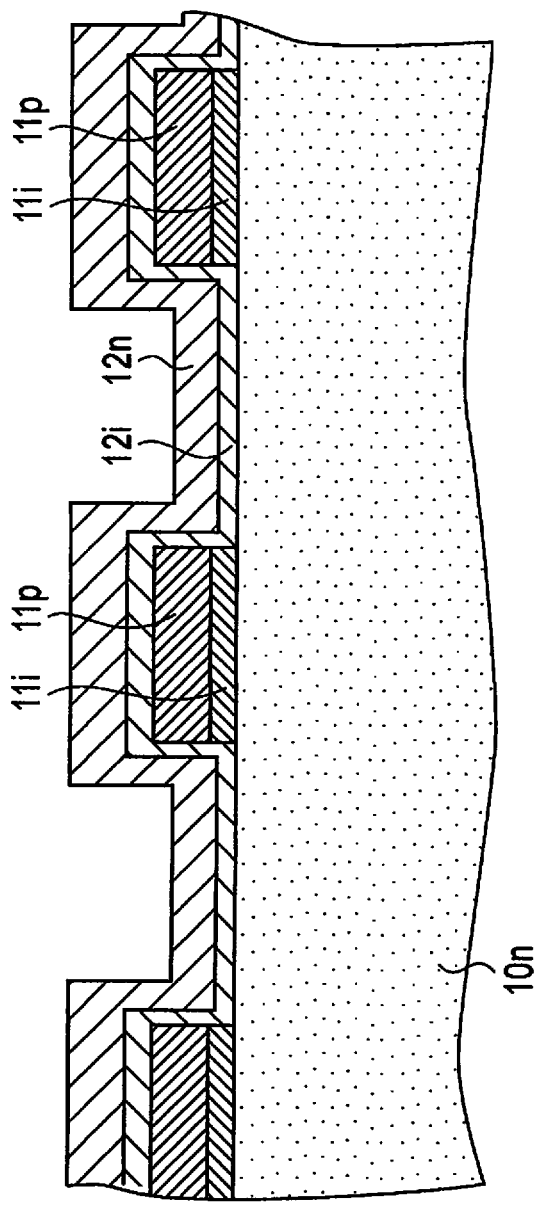
FIG. 6 is a diagram explaining the method of manufacturing the solar cell 10 according to the first embodiment of the present invention.

Next, as illustrated in FIG. 6, the i-type amorphous semiconductor layer 12i and the n-type amorphous semiconductor layer 12n are formed in this order by use of a CVD method on the back surface of the n-type crystalline silicon substrate 10n and also on the p-type amorphous semiconductor layer 11p.

Next, the p-side electrodes 20p and the n-side electrodes 20n are formed in a predetermined pattern on the n-type amorphous semiconductor layer 12n by use of a CVD method, a sputtering method, a vapor deposition method, a plating method or a printing method or the like.

(Operational Effects)

The method of manufacturing the solar cell 100 according to the first embodiment includes the step of cleaning the exposed regions R2 of the back surface of n-type crystalline silicon substrate 10n after the step of patterning the i-type amorphous semiconductor layer 11i and the p-type amorphous semiconductor layer 11p but before the step of forming the i-type amorphous semiconductor layer 12i.

Accordingly, this method can prevent recombination of carriers in the boundary between the back surface of the n-type crystalline silicon substrate 10n and the i-type amorphous semiconductor layer 12i.

In addition, the i-type amorphous semiconductor layer 12i and the n-type amorphous semiconductor layer 12n are formed in this order after the step of cleaning the exposed regions R2 in the method of manufacturing the solar cell 100 according to the first embodiment. Thus, the i-type amorphous semiconductor layer 12i and the n-type amorphous semiconductor layer 12n do not have to be patterned by a mask or the like. For this reason, the productivity of the solar cell 100 can be improved.

Second Embodiment

Hereinafter, a description will be given of a solar cell 100 according to a second embodiment with reference to the drawings. The description will be mainly given of differences from the first embodiment below. To put it more specifically, the solar cell 100 according to the second embodiment includes a recombination layer R inserted between the p-type amorphous semiconductor layer 11p and the i-type amorphous semiconductor layer 12i.

(Configuration of Solar Cell)

Figure 7:
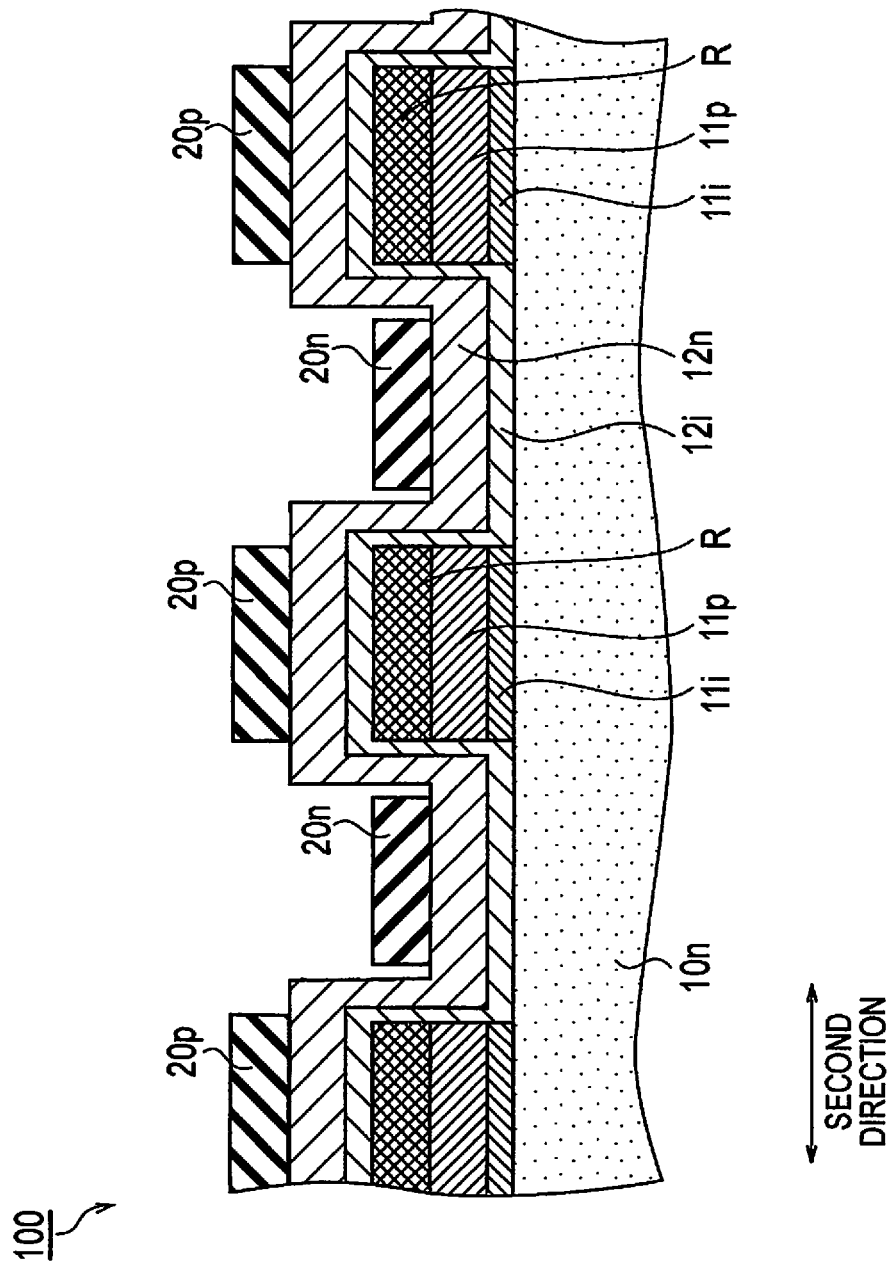
FIG. 7 is an enlarged cross-sectional view of a solar cell 100 according to a second embodiment of the present invention.

A description will be given of a configuration of the solar cell according to the second embodiment of the present invention with reference to FIG. 7. FIG. 7 is a cross-sectional view of the solar cell 100 according to the second embodiment.

As illustrated in FIG. 7, the solar cell 100 includes the recombination layer R on the p-type amorphous semiconductor layer 11p.

The recombination layer R is provided for the purpose of preventing the p-type amorphous semiconductor layer 11p, the i-type amorphous semiconductor layer 12i and the n-type amorphous semiconductor layer 12n from forming an electric field in a direction opposite to an electric field formed by the n-type crystalline silicon substrate 10n, the i-type amorphous semiconductor layer 11i and the p-type amorphous semiconductor layer 11p. Thus, a reduction in the resistance between the p-side electrodes 20p and the p-type amorphous semiconductor layer 11p is achieved by insertion of the recombination layer R in this embodiment.

Note that, in order to suppress an increase in the resistance component, the thickness of the recombination layer R is preferably 0.1 to 20 nm, or more preferably, 1 to 10 nm.

The recombination layer R having the aforementioned characteristics is formed of (1) a semiconductor material in which a large number of in-gap states existing in an energy band exist, or (2) a metal material that forms an ohmic contact with the p-type amorphous semiconductor layer 11p.

(1) Semiconductor Material in which a Large Number of in-Gap States Exist in Energy Band In a case where such a semiconductor material is used, the carriers generated in the n-type crystalline silicon substrate 10n via the p-type amorphous semiconductor layer 11p can be extracted by utilizing recombination of carriers via a large number of in-gap states in an energy band. Accordingly, even when the recombination layer R is formed on the surface of the p-type amorphous semiconductor layer 11p, the contact between the both layers has a low resistance, i.e., comes near an ohmic contact.

In addition, as described above, since the thickness of the i-type amorphous semiconductor layer 12i formed on the surface of the recombination layer R is extremely thin, the function thereof as a barrier wall against the carriers is extremely small.

As described above, since a reduction in the resistance between the p-side electrodes 20p and the p-type amorphous semiconductor layer 11p is achieved, the carriers can be extracted through the p-side electrodes 20p in a good state.

Here, as the semiconductor material forming the recombination layer R, it is possible to use (i) a semiconductor material containing a large amount of impurities or (ii) a semiconductor material containing a large number of lattice defects. Note that, it is also possible to use a p-type semiconductor material containing a larger amount of p-type impurities than the p-type amorphous semiconductor layer 11p, or, as the material described in (i), a p-type semiconductor material containing a larger amount of p-type impurities than the p-type amorphous semiconductor layer 11p, or an n-type semiconductor material containing a larger amount of n-type impurities than the n-type amorphous semiconductor layer 12n or the like. Meanwhile, as the material described in (ii), it is possible to use a semiconductor material in which lattice defects are increased by mixing an element of a different kind such as carbon or germanium in amorphous silicon (amorphous silicon carbide or amorphous silicon germanium), or p-type or n-type microcrystalline silicon or the like, for example.

Note that, in a case where the conductivity type of the recombination layer R is p-type, it is possible to suppress an increase in the manufacturing costs because the recombination layer R can be formed by use of the same raw material gas as that for the amorphous semiconductor layer 12p.

(2) Metal Material that Forms an Ohmic Contact with the P-Type Amorphous Semiconductor Layer 11p In a case where such a metal material is used, even when the recombination layer R is formed on the surface of the p-type amorphous semiconductor layer 11p, the contact between the both layers has a low resistance, i.e., comes near an ohmic contact. Accordingly, since a reduction in the resistance between the p-side electrodes 20p and the p-type amorphous semiconductor layer 11p is achieved, the carriers can be extracted through the p-side electrodes 20p in a good state.

Note that, as the metal material described above, titanium (Ti) or tungsten (W) or the like can be used.

(Method of Manufacturing Solar Cell)

Next, a description will be given of a method of manufacturing the solar cell 100 according to the second embodiment with reference to the cross-sectional views of the solar cell 100.

Figure 8:
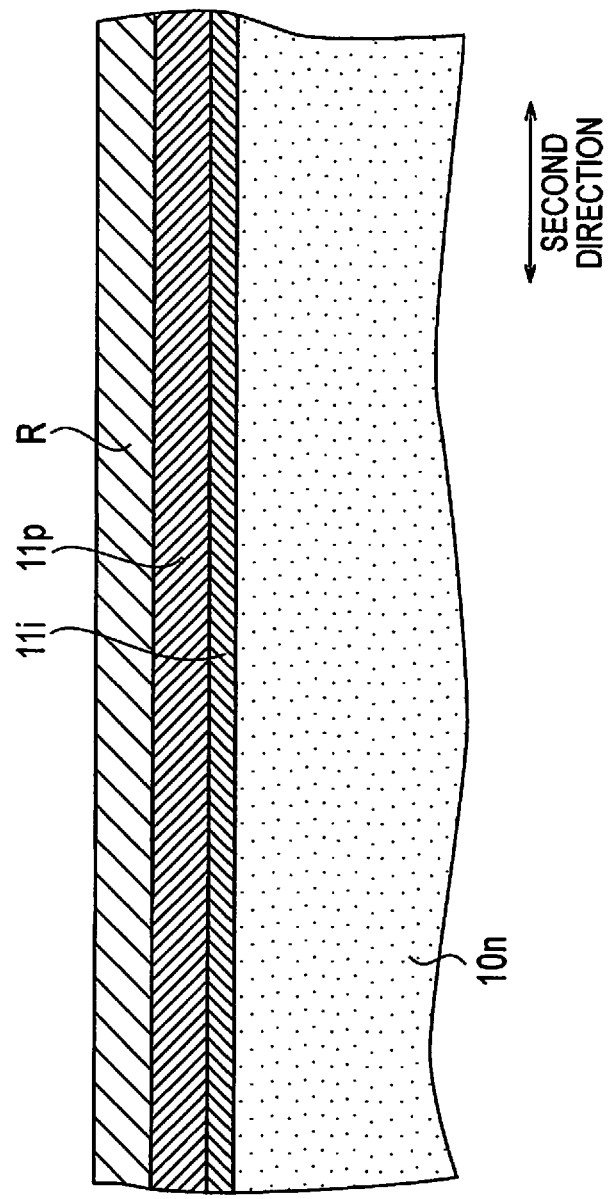
FIG. 8 is a diagram explaining the method of manufacturing the solar cell 10 according to the second embodiment of the present invention.

First, as illustrated in FIG. 8, the recombination layer R is formed after the i-type amorphous semiconductor layer 11i and the p-type amorphous semiconductor layer 11p are formed in this order on the entire back surface of the n-type crystalline silicon substrate 10n by use of a CVD method. In a case where the recombination layer R is formed by use of a semiconductor material, a CVD method or the like is used. In a case where the recombination layer R is formed by use of a metal material, a sputtering method or a vapor deposition method can be used.

Figure 9:
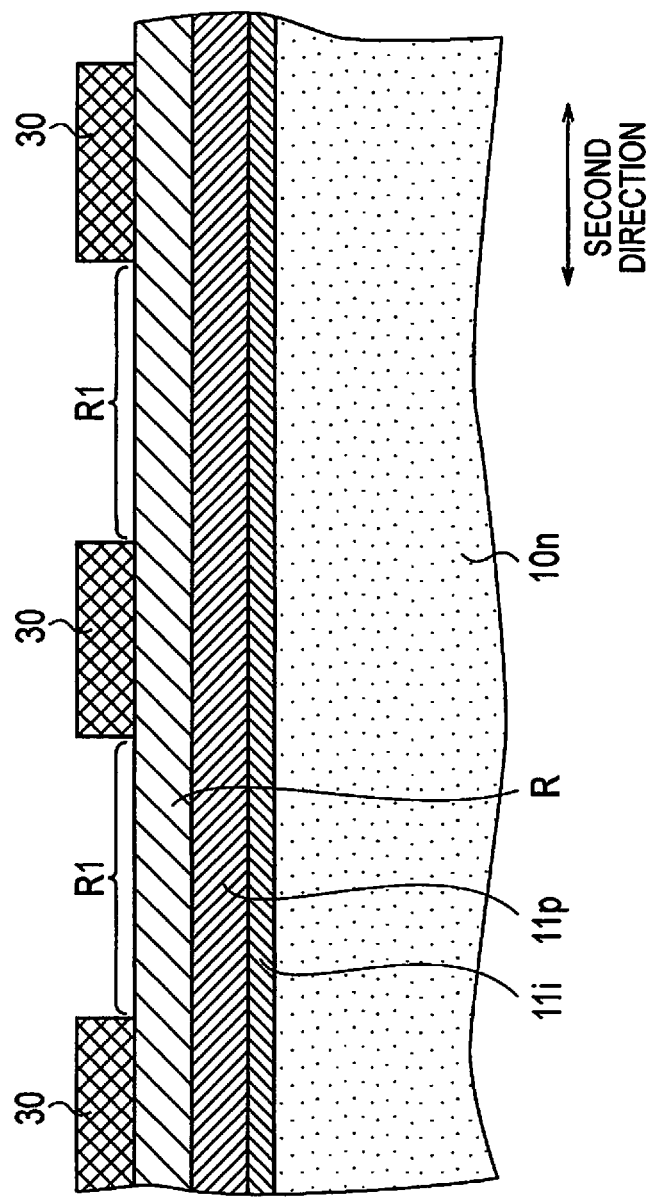
FIG. 9 is a diagram explaining the method of manufacturing the solar cell 10 according to the second embodiment of the present invention.

Next, as illustrated in FIG. 9, a resist film 30 is applied onto the recombination layer R in a predetermined pattern. The predetermined pattern corresponds to regions where the p-side electrodes 20p are formed. Thus, the predetermined pattern is set along a dashed-dotted line of FIG. 1 as the basis, for example.

Figure 10:
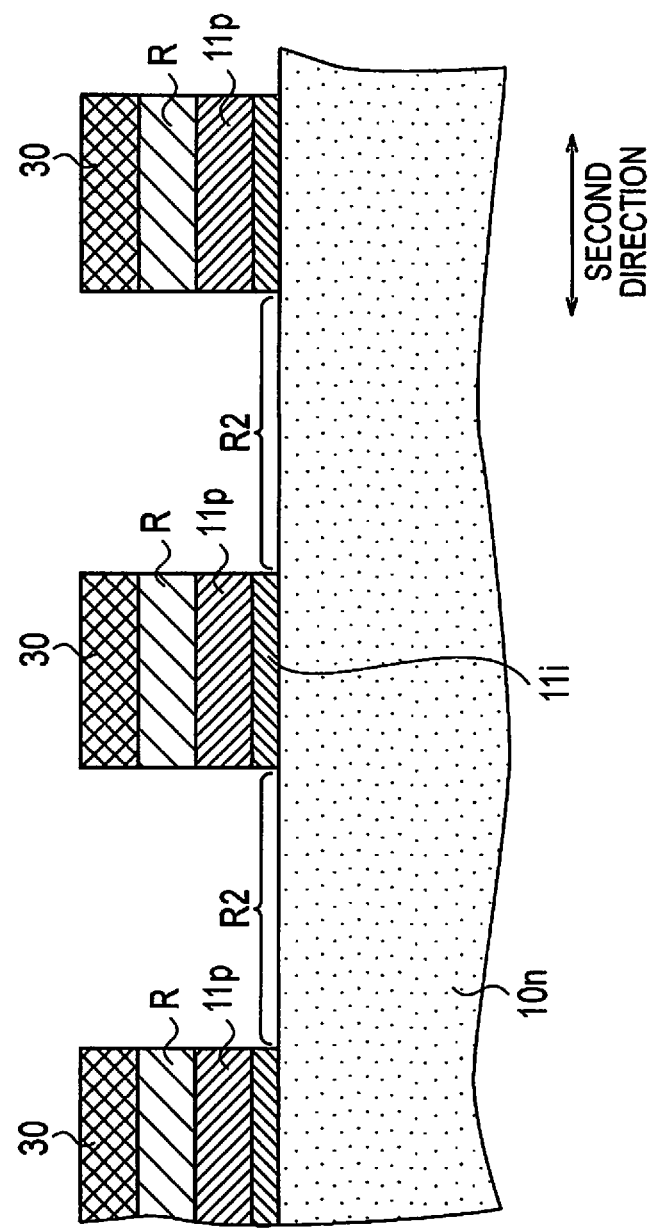
FIG. 10 is a diagram explaining the method of manufacturing the solar cell 10 according to the second embodiment of the present invention.

Next, as illustrated in FIG. 10, a wet etching process is performed for removal of exposed regions R1 of the i-type amorphous semiconductor layer 11i, the p-type amorphous semiconductor layer 11p and the recombination layer R, which are exposed from the resist film 30. Thus, the i-type amorphous semiconductor layer 11i, the p-type amorphous semiconductor layer 11p and the recombination layer R are patterned. Subsequently, after removal of the resist film 30, a wet etching process and a hydrogen plasma process are performed for cleaning exposed regions R2 of the back surface of the n-type crystalline silicon substrate 10n, which are the exposed regions thereof. During this cleaning, the wet etching process and the hydrogen plasma process may be performed on the recombination layer R as well.

Figure 11:
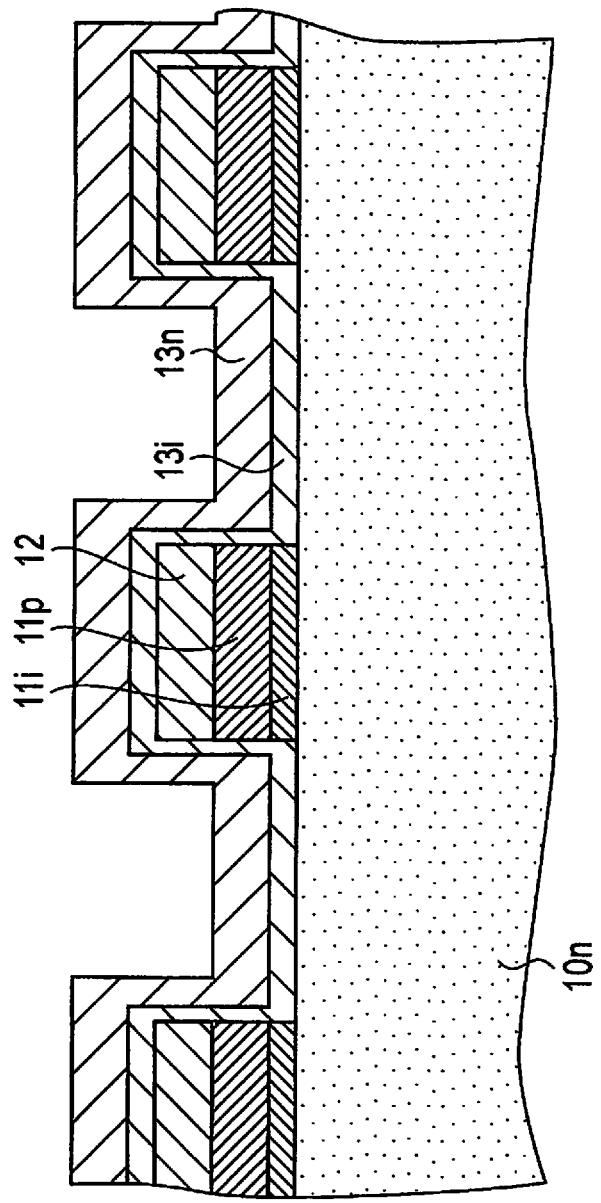
FIG. 11 is a diagram explaining the method of manufacturing the solar cell 10 according to the second embodiment of the present invention.

Next, as illustrated in FIG. 11, the i-type amorphous semiconductor layer 12i and the n-type amorphous semiconductor layer 12n are formed in this order by use a CVD method on the back surface of the n-type crystalline silicon substrate 10n and also on the recombination layer R.

Next, the p-side electrodes 20p and the n-side electrodes 20n are formed in a predetermined pattern on the n-type amorphous semiconductor layer 12n by use of a CVD method, a sputtering method, a vapor deposition method, a plating method or a printing method or the like.

(Operational Effects)

The method of manufacturing the solar cell 100 according to the second embodiment includes the step of forming the recombination layer R on the p-type amorphous semiconductor layer 11p. The i-type amorphous semiconductor layer 12i and the n-type amorphous semiconductor layer 12n are formed in this order on the back surface of the n-type crystalline silicon substrate 10n and also on the recombination layer R.

As described above, the solar cell 100 has the recombination layer R inserted between the p-type amorphous semiconductor layer 11p and the n-type amorphous semiconductor layer 12n. The p-type amorphous semiconductor layer 11p and the recombination layer R are in contact with each other with a low resistance.

Thus, the p-type amorphous semiconductor layer 11p, the i-type amorphous semiconductor layer 12i and the n-type amorphous semiconductor layer 12n can be prevented from forming an electric field in a direction opposite to an electric field formed by the n-type crystalline silicon substrate 10n, the i-type amorphous semiconductor layer 11i and the p-type amorphous semiconductor layer 11p. Thus, a reduction in the resistance between the p-side electrodes 20p and the p-type amorphous semiconductor layer 11p is achieved. Accordingly, the carriers can be extracted through the p-side electrodes 20p in a good state. As a result, a carrier collection loss can be reduced. Thus, it is possible to improve the characteristics of the solar cell 100.

In addition, no cleaning process is performed on the surface of the p-type amorphous semiconductor layer 11p since the surface of the p-type amorphous semiconductor layer 11p is covered by the recombination layer R in the method of manufacturing the solar cell 100 according to the second embodiment.

Accordingly, it is possible to suppress influence of the cleaning process on the surface of the p-type amorphous semiconductor layer 11p. As a result, the characteristics of the solar cell 100 can be improved.

Other Embodiments

As described above, the details of the present invention have been disclosed by using the embodiments of the present invention. However, it should not be understood that the description and drawings which constitute part of this disclosure limit the present invention. From this disclosure, various alternative embodiments, examples, and operation techniques will be easily found by those skilled in the art.

In the aforementioned embodiments, for example, the n-type crystalline silicon substrate 10n is used as the substrate of the solar cell 100, but the substrate of the solar cell 100 is not limited to this. The substrate of the solar cell 100 may have p-type conductivity, for example. In addition, the substrate of the solar cell 100 may be formed of a crystalline semiconductor material such as polycrystalline Si, microcrystalline Si or the like, or a general semiconductor material including a compound semiconductor material such as GaAs, InP or the like.

In addition, the p-type amorphous semiconductor layer 11p is formed on the back surface of the n-type crystalline silicon substrate 10n, and the n-type amorphous semiconductor layer 12n is formed thereafter in the aforementioned embodiments, but the formation sequence is not limited to this. The formation sequence of the p-type amorphous semiconductor layer 11p and the n-type amorphous semiconductor layer 12n may be reversed, for example. To be more specific, the p-type amorphous semiconductor layer 11p may be formed after the n-type amorphous semiconductor layer 12n is formed on the back surface of the n-type crystalline silicon substrate 10n.

In addition, although it is not mentioned in particular in the aforementioned embodiments, the p-type amorphous semiconductor layer 11p and the n-type amorphous semiconductor layer 12n are preferably formed in positions reverse to the positions in the aforementioned embodiments when a p-type substrate is used. In other words, the n-type amorphous semiconductor layer 12n is formed to cover the i-type amorphous semiconductor layer 11i. In this case, a leakage between the p-side electrodes 20p and the n-side electrodes 20n is more likely to be prevented from occurring because n-type amorphous silicon has a larger electric resistance than p-type amorphous silicon in general.

Moreover, the i-type amorphous semiconductor layer 11i and the i-type amorphous semiconductor layer 12i are formed without active introduction of impurities in the aforementioned embodiments, but the i-type amorphous semiconductor layer 11i and the i-type amorphous semiconductor layer 12i may contain a slight amount of dopant.

In addition, although it is not mentioned in particular in the aforementioned embodiments, the i-type amorphous semiconductor layer 13i may not be formed on the back surface of the n-type crystalline silicon substrate 10n. In this case, the resistance of the back surface side of the n-type crystalline silicon substrate 10n can be further reduced.

Moreover, the recombination layer R is configured of a single layer structure in the aforementioned embodiments, but is not limited to this configuration. The recombination layer R may be configured of a structure further including another layer capable of keeping an ohmic contact with the p-type amorphous semiconductor layer 11p.

In addition, the p-type amorphous semiconductor layer 11p is configured of a single layer structure in the aforementioned embodiments, but is not limited to this configuration. The p-type amorphous semiconductor layer 11p may be configured of a structure further including another layer capable of keeping an ohmic contact with the recombination layer R.

Note that the entire content of Japanese Patent Application No. 2009-44435 (filed on Feb. 26, 2009) is incorporated herein by reference.

INDUSTRIAL APPLICABILITY

As described above, the method of manufacturing a solar cell according to the present invention is useful in the production field of solar cells because a solar cell capable of preventing recombination of carriers can be provided.

EXPLANATION OF REFERENCE NUMERALS

10 SOLAR CELL
10n n-TYPE CRYSTALLINE SILICON SUBSTRATE
11i i-TYPE AMORPHOUS SEMICONDUCTOR LAYER
11p p-TYPE AMORPHOUS SEMICONDUCTOR LAYER
R RECOMBINATION LAYER
12i i-TYPE AMORPHOUS SEMICONDUCTOR LAYER
12n n-TYPE AMORPHOUS SEMICONDUCTOR LAYER
20n n-SIDE ELECTRODE
20p p-SIDE ELECTRODE
30 RESIST FILM
100 SOLAR CELL

The invention claimed is:

1. A method of manufacturing a solar cell comprising:
a step A of forming a first semiconductor layer having a first conductivity type on a first region and a second region of a main surface of a semiconductor substrate;
a step B of removing the first semiconductor layer on the second region and exposing the second region of the main surface;
after completion of step B, a step C of cleaning the second region of the main surface; and
a step D of depositing a second semiconductor layer having a second conductivity type on the second region of the main surface and also on the first semiconductor layer,
further comprising a step of forming a recombination layer on the first semiconductor layer between the step A and the step B, wherein
the second semiconductor layer is formed on the second region and also on the recombination layer in the step D,
wherein the recombination layer is a semiconductor layer having the first conductivity type, and
the amount of impurities of the first conductivity type contained in the semiconductor layer is larger than the amount of impurities of the first conductivity type contained in the first semiconductor layer,
wherein the recombination layer is a microcrystalline semiconductor layer, and
each of the first semiconductor layer and the second semiconductor layer is an amorphous semiconductor layer,
wherein step C comprises a wet process and hydrogen gas process.

2. The method of manufacturing a solar cell according to claim 1, wherein the step B includes the steps of:
covering by a resist film, a portion of the first semiconductor layer which is formed on the first region;
removing a portion of the first semiconductor layer which is exposed from the resist film; and
removing the resist film.

3. The method of manufacturing a solar cell according to claim 1, wherein the semiconductor substrate has the first conductivity type.

4. The method of manufacturing a solar cell according to claim 1, wherein the recombination layer is a layer formed by mixing elements of a different kind in the first semiconductor layer.

5. The method of manufacturing a solar cell according to claim 1, wherein the recombination layer has a thickness of 1 to 10 nm.

6. The method of manufacturing a solar cell according to claim 1, wherein step C comprises a wet process.

* * * * *